US012628277B2

(12) United States Patent
Speinle et al.

(10) Patent No.: US 12,628,277 B2
(45) Date of Patent: May 12, 2026

(54) POWER CIRCUIT ASSEMBLY FOR A VEHICLE

(71) Applicant: Robert Bosch GmbH, Stuttgart (DE)

(72) Inventors: Andreas Speinle, Elzach (DE); Armin Ruf, Stuttgart (DE); Manuel Wild, Stuttgart (DE); Walter Von Emden, Eningen Unter Achalm (DE)

(73) Assignee: ROBERT BOSCH GMBH, Stuttgart (DE)

( * ) Notice: Subject to any disclaimer, the term of this patent is extended or adjusted under 35 U.S.C. 154(b) by 336 days.

(21) Appl. No.: 18/572,524

(22) PCT Filed: Aug. 2, 2022

(86) PCT No.: PCT/EP2022/071649
§ 371 (c)(1),
(2) Date: Dec. 20, 2023

(87) PCT Pub. No.: WO2023/016856
PCT Pub. Date: Feb. 16, 2023

(65) Prior Publication Data
US 2024/0291414 A1 Aug. 29, 2024

(30) Foreign Application Priority Data

Aug. 11, 2021 (DE) ..................... 10 2021 208 752.3

(51) Int. Cl.
*H05K 1/14* (2006.01)
*H05K 1/02* (2006.01)
(Continued)

(52) U.S. Cl.
CPC .......... *H05K 1/148* (2013.01); *H05K 1/0277* (2013.01); *H05K 1/14* (2013.01); *H05K 1/181* (2013.01);
(Continued)

(58) Field of Classification Search
None
See application file for complete search history.

(56) References Cited

U.S. PATENT DOCUMENTS

2009/0263140 A1* 10/2009 Kagaya ................ H05K 1/0253
398/139
2021/0165051 A1* 6/2021 Doyle .................. G01K 15/007

FOREIGN PATENT DOCUMENTS

DE 10204200 A1 8/2003
DE 102008061585 A1 6/2010
(Continued)

OTHER PUBLICATIONS

DE_102012218604_Translation (Year: 2014).*
(Continued)

*Primary Examiner* — Thienvu V Tran
*Assistant Examiner* — Jennifer C Caulk
(74) *Attorney, Agent, or Firm* — NORTON ROSE FULBRIGHT US LLP

(57) ABSTRACT

A power circuit assembly for a vehicle. The power circuit assembly includes a first circuit carrier on which at least two power semiconductor switches are arranged; at least one energy store which provides a high voltage and which can be discharged via at least one discharge resistor; a second circuit carrier on which at least two driver circuits are arranged, which are respectively assigned to one of the at least two power semiconductor switches; and a flexible printed circuit board which includes at least one line and electrically connects the first circuit carrier and the second circuit carrier to one another. An inverter including the power circuit assembly for a vehicle is also described.

13 Claims, 3 Drawing Sheets

(51) Int. Cl.
      *H05K 1/181*          (2026.01)
      *H05K 7/20*           (2006.01)

(52) U.S. Cl.
      CPC ...  *H05K 7/209* (2013.01); *H05K 2201/10053*
                                                          (2013.01)

(56)                    References Cited

FOREIGN PATENT DOCUMENTS

| | | | | |
|---|---|---|---|---|
| DE | 102012218604 | A1 * | 4/2014 | ................ B60L 3/04 |
| DE | 112012004810 | T5 | 8/2014 | |
| DE | 112018005546 | T5 * | 6/2020 | ............ H05K 1/148 |
| DE | 102020200106 | A1 | 7/2021 | |
| JP | 6824361 | B1 * | 2/2021 | ............... H05K 7/02 |

OTHER PUBLICATIONS

DE_112018005546_Translation (Year: 2020).*
International Search Report for PCT/EP2022/071649, Issued Dec.
13, 2022.

* cited by examiner

POWER CIRCUIT ASSEMBLY FOR A VEHICLE

FIELD

The present invention relates to a power circuit assembly for a vehicle, which can in particular be used in an inverter for electric machines. In addition, the present invention relates to an inverter for an AC electric machine comprising such a power circuit assembly.

BACKGROUND INFORMATION

Electrically driven vehicles, such as battery electric vehicles, hybrid vehicles or fuel cell vehicles, share the challenge of safely handling high voltages of, for example, 400V or 800V in the vehicle. Since voltages above 60 volts are hazardous to humans, safe handling of high-voltage components, for example during maintenance or in the case of crashes, is an important aspect. There are therefore various safety requirements that dictate that energy storage elements, for example DC coupling capacitors with a capacity of several hundred microfarads, should be discharged to safe voltage values below 60 volts within specific time periods. For this purpose, various circuit assemblies for discharging energy stores are available, which comprise active and passive discharge components. Typically, a circuit with wiring, plug connectors, and passive ohmic resistors is used. Alternatively, insulating substrates with printed thin-layer resistors or printed thick-layer resistors are used, which are fastened to a heat sink.

For example, a circuit assembly, which can be used in a power converter, for discharging an electrical energy store is described in German Patent Application No. DE 10 2012 218 604 A1. The circuit assembly comprises, for uncontrolled, passive discharging of the energy store, a first discharge current path which extends from a first, positive power connection of the energy store to a second, negative power connection of the energy store and comprises a first discharge resistor which limits the current in the first discharge current path. For active discharging of the energy store, the circuit assembly comprises a second discharge current path which extends from the positive power connection of the energy store to the negative power connection of the energy store in parallel to the first discharge current path and comprises a second discharge resistor which can be connected via a controllable semiconductor switch and limits the current in the first discharge current path. The discharging speed of the respective discharge current path can be set via resistance values of the two discharge resistors, wherein the first discharge resistor has a significantly higher resistance value than the second discharge resistor. The two discharge resistors are each designed as a thick-layer resistor, which is printed from resistor paste onto a ceramic carrier material in a screen printing process. In this case, the two thick-layer resistors of the first and the second discharge resistor are monolithically formed on one and the same carrier material.

SUMMARY

A power circuit assembly for a vehicle with features of the present invention may have the advantage that by integrating the at least one discharge resistor as a conductor structure into a flexible printed circuit board, which electrically connects a first circuit carrier of the power circuit assembly to a second circuit carrier of the power circuit assembly by means of at least one line, already existing structural elements of the power circuit assembly can be used to discharge at least one energy store by converting the charged electrical energy into thermal energy within a predetermined time period to a voltage value of below 60 volts, which is harmless to humans. Thus, the at least one discharge resistor is no longer a single discrete element or substrate but a conductor structure integrated into the flexible printed circuit board. This results in system advantages in terms of module size (installation space) and integration density since they are not or only insignificantly extended to implement the discharge function.

Embodiments of the present invention provide a power circuit assembly for a vehicle, which assembly comprises a first circuit carrier on which at least two power semiconductor switches are arranged; at least one energy store which provides a high voltage and can be discharged via at least one discharge resistor; a second circuit carrier on which at least two driver circuits are arranged, which are respectively assigned to one of the at least two power semiconductor switches; and a flexible printed circuit board which comprises at least one line and electrically connects the first circuit carrier and the second circuit carrier to one another. In this case, the at least one discharge resistor is designed as a conductor structure and is integrated into the flexible printed circuit board. The flexible printed circuit board is thermally coupled to a heat sink in the region of the at least one conductor structure so that heat from resistor power losses of the at least one conductor structure is transferred directly to the heat sink.

In addition, according to an example embodiment of the present invention, an inverter for an AC electric machine is provided, which inverter is looped in between a DC voltage supply and the AC machine and comprises at least one such power circuit assembly.

By thermally coupling the at least one conductor structure to the heat sink, active cooling of the at least one conductor structure is possible so that the latter can carry much more current or higher power losses. This enables high power dissipation with minimum space consumption. Advantageously, according to an example embodiment of the present invention, the at least one conductor structure is integrated into the existing structure of the flexible printed circuit board, without much additional area cost. In this case, not only the at least one conductor structure but also supply lines and/or connecting conductor paths or connecting lines for control signals and/or sensor signals are integrated into the flexible printed circuit board. In this case, the connecting conductor paths or the connecting lines and/or the supply lines can preferably be designed to be wider than the conductors of the at least one conductor structure. In addition, several different layers of the flexible printed circuit board can be used for a greater overall length of the at least one conductor structure and thus for the realization of a greater ohmic resistance value. The at least one conductor structure can be electrically insulated from the connecting conductor paths or connecting lines or supply lines and from the heat sink by plastic films, for example. Due to the excellent insulation properties, the at least one conductor structure can be used for low voltages (<60V) and/or high voltages (e.g., 800V). The flexible printed circuit board can be electrically connected to the second circuit carrier via plug connections or soldered connections, for example.

In embodiments of the power circuit assembly according to the present invention, a discrete discharge resistor, including wiring and contacting, can be saved for the realization of the discharge function for the at least one energy store. This can reduce the production time period, complexity and costs in the production line. Embodiments of the power circuit assembly according to the present invention thus offer a lean and cost-effective solution for realizing the safety function "active discharge" of the at least one energy store. Furthermore, lower complexity and a reduced number of components and elements result in a lower probability of failure over the lifetime and thus in high reliability.

Advantageous improvements to the power circuit assembly for a vehicle according to the present invention are made possible by the measures and developments disclosed herein.

It is particularly advantageous that the at least one conductor structure can be designed as a meandering structure or as a zigzag structure or as a spiral structure or as a strip structure. Any ohmic resistance values for the corresponding discharge resistor can be specified over a total length of the conductor of the at least one conductor structure.

In an advantageous embodiment of the power circuit assembly according to the present invention, the flexible printed circuit board can be designed in multiple layers, wherein the at least one conductor structure can extend over several layers. By arranging the at least one conductor structure in several layers of the flexible printed circuit board, a greater overall length for the conductor of the at least one conductor structure can be implemented and a greater ohmic resistance can thus be realized for the corresponding discharge resistor.

In a further, advantageous embodiment of the power circuit assembly of the present invention, the flexible printed circuit board can be connected to the heat sink at least in the region of the at least one conductor structure, for example by soldering or gluing or sintering or via an outer, thermally conductive coating. As a result, the thermal connection of the at least one conductor structure with the heat sink can be adapted to the respective embodiment of the heat sink.

In a further advantageous embodiment of the power circuit assembly of the present invention, the first circuit carrier can be designed as an AMB substrate or a DBC substrate. In this case, the first circuit carrier can be thermally connected to a cooling device via a first metal layer. The cooling device can preferably be designed as a pin-fin cooler. In addition, the outer, thermally conductive coating of the flexible printed circuit board in the region of the at least one conductor structure can be connected to a second metal layer of the first circuit carrier as a heat sink. As a result, the power circuit assembly for realizing the discharge function can additionally benefit from the use of the already existing cooling device for cooling the first circuit carrier, which can additionally be used via the first circuit carrier to cool the at least one conductor structure. This embodiment of the power circuit assembly according to the present invention achieves additional advantages in terms of space requirement and system costs for the implementation of the discharge function for the at least one energy store.

In a further, advantageous embodiment of the power circuit assembly of the present invention, the flexible printed circuit board can be electrically connected to the second circuit carrier via a transition piece and at least one contacting region. In this case, the transition piece can bridge a gap or a clearance or a spatial distance between the first circuit carrier and the second circuit carrier. The contacting region can, for example, be designed as a plug or as a plug receptacle or as a soldering point.

In a further, advantageous embodiment of the power circuit assembly of the present invention, a discharge switch arranged on the second circuit carrier can be designed to electrically connect the at least one discharge resistor to the at least one energy store for active discharging. The discharge switch is preferably designed as a semiconductor switch.

In a further, advantageous embodiment of the power circuit assembly of the present invention, a voltage transformer, which converts a high voltage of the at least one energy store into a low voltage of less than 60 volts, can be arranged on the second circuit carrier. In this case, the discharge switch can be arranged between a low-voltage output of the voltage transformer and the at least one contacting region of the flexible printed circuit board. As a result, the at least one conductor structure is likewise operated at the low voltage, which is less than 60 volts and has a value of, for example, 18 volts.

In a further, advantageous embodiment of the power circuit assembly of the present invention, a measuring resistor can be arranged between the discharge switch and the at least one contacting region of the flexible printed circuit board and can be used to measure a current discharge current. This enables current and/or voltage monitoring in the discharge function.

An exemplary embodiment of the present invention is shown in the figures and is explained in more detail in the following description. In the figures, identical reference signs indicate components or elements that perform identical or analogous functions.

DETAILED DESCRIPTION OF EXAMPLE EMBODIMENTS

Figure 1:
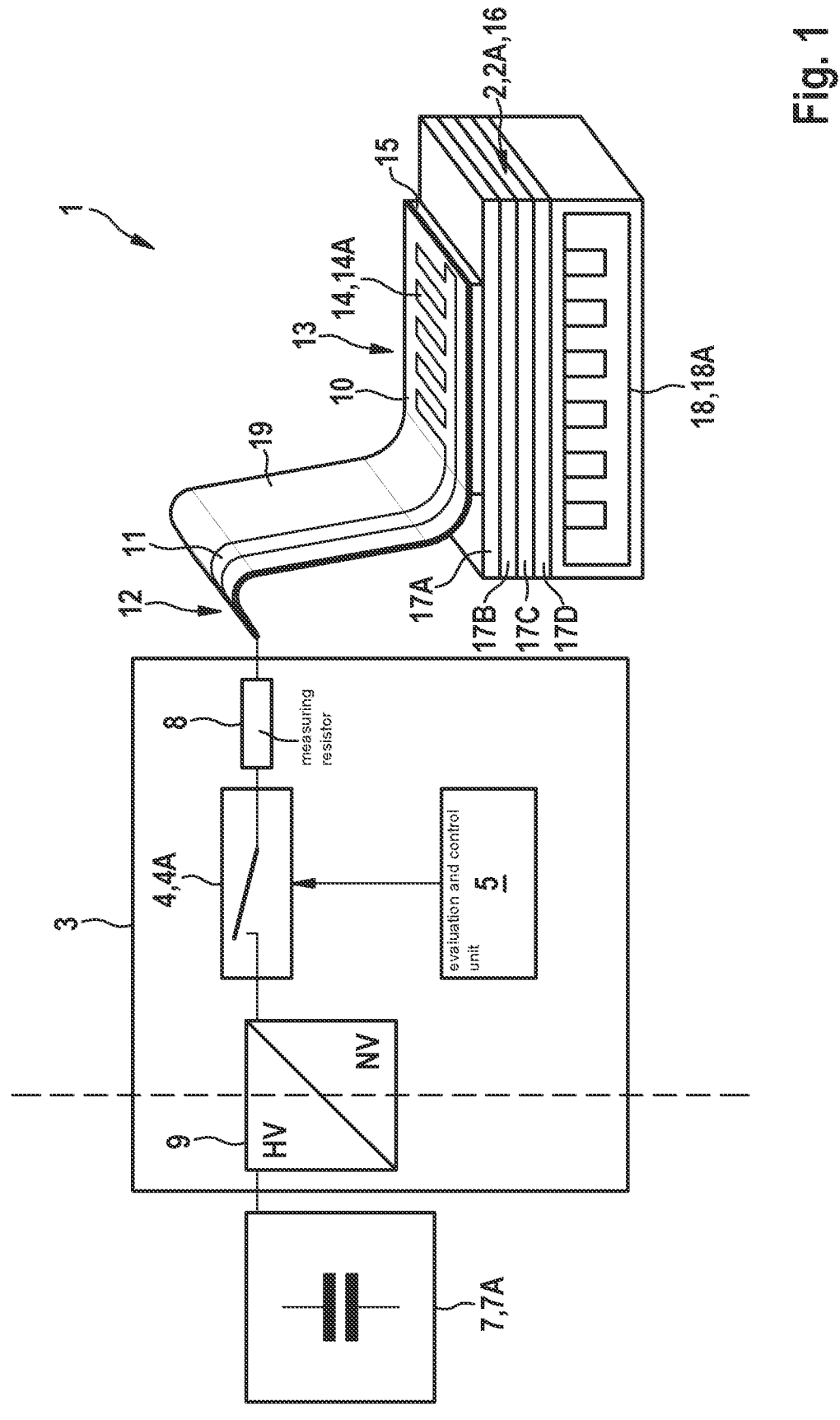
FIG. 1 shows a schematic representation of an exemplary embodiment of a power circuit assembly according to the present invention for a vehicle.
Figure 2:
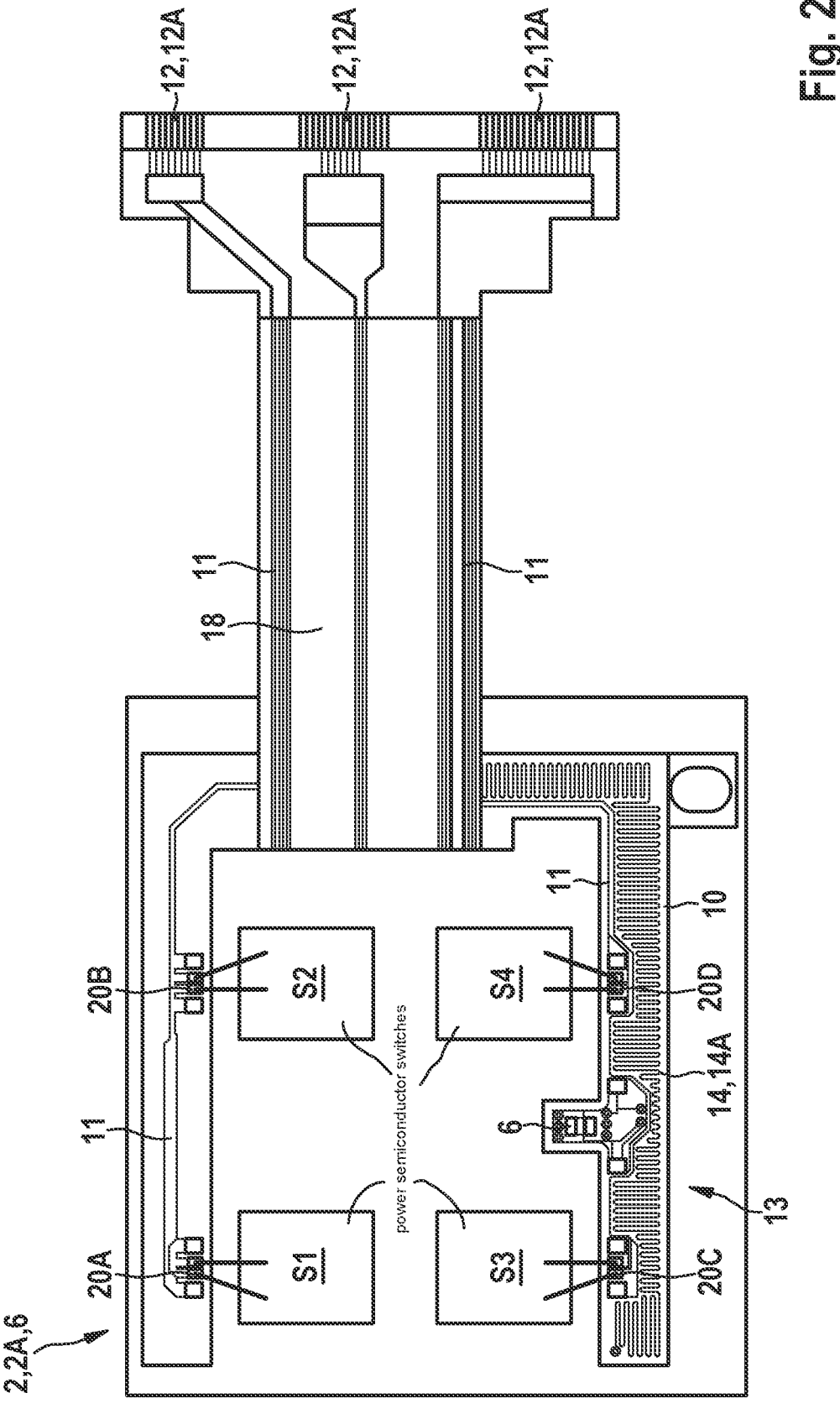
FIG. 2 shows a schematic representation of a first circuit carrier and of a flexible printed circuit board of the power circuit assembly according to the present invention of FIG. 1.
Figure 3:
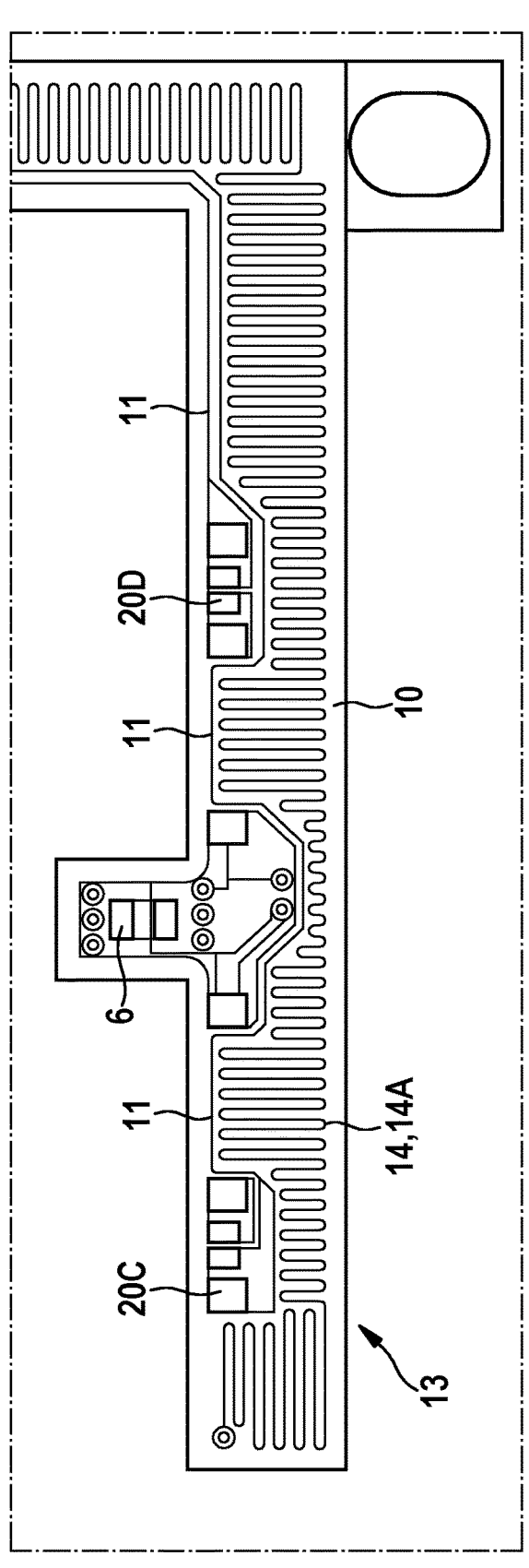
FIG. 3 shows a detailed representation of a detail of the flexible printed circuit board of the power circuit assembly according to the present invention of FIGS. 1 and 2.

As can be seen in FIGS. 1 to 3, the exemplary embodiment shown of a power circuit assembly 1 according to the present invention for a vehicle comprises a first circuit carrier 2 on which at least two power semiconductor switches S1, S2, S3, S4 are arranged; at least one energy store 7 which provides a high voltage and can be discharged via at least one discharge resistor 13; a second circuit carrier 3 on which at least two driver circuits are arranged, which are respectively assigned to one of the at least two power semiconductor switches S1, S2, S3, S4; and a flexible printed circuit board 10 which comprises at least one line 11 and electrically connects the first circuit carrier 2 and the second circuit carrier 3 to one another. In this case, the at least one discharge resistor 13 is designed as a conductor structure 14 and is integrated into the flexible printed circuit board 10. The flexible printed circuit board 10 is thermally coupled to a heat sink 16 in the region of the at least one conductor structure 14 so that heat from resistor power losses of the at least one conductor structure 14 is transferred directly to the heat sink 16.

As can further be seen in FIG. 2, in the exemplary embodiment shown of the power circuit assembly 1, four power semiconductor switches S1, S2, S3, S4 are arranged on the first circuit carrier 2, which is designed, by way of example, as an AMB substrate 2A. In this case, a first metal layer 17C, here a copper layer, arranged under a ceramic layer 17B of the first circuit carrier 2 designed as an AMB substrate 2A is thermally connected to a cooling device 16 via a solder layer 17D. The cooling device 16 in the exemplary embodiment shown is designed as a pin-fin cooler 16A. Of course, other suitable embodiments of the first circuit carrier 2 are also possible. For example, the first circuit carrier 2 can be designed as a DBC substrate.

The power circuit assembly 1 shown comprises only one energy store 7, designed as a capacitor 7A, and four driver circuits (not shown in detail) arranged on the second circuit carrier 3 for actuating the four power semiconductor switches S1, S2, S3, S4. For this purpose, control inputs of the four power semiconductor switches S1, S2, S3, S4 are electrically contacted via bonded connections to corresponding contact surfaces 20A, 20B, 20C, 20D of the flexible printed circuit board 10. The contact surfaces 20A, 20B, 20C, 20D are electrically connected via corresponding lines 11 to the driver circuits on the second circuit carrier 3. In the exemplary embodiment shown, the flexible printed circuit board 10 has a U-shape and can be electrically connected to the second circuit carrier 3 via a transition piece 19 and several contacting regions 12 designed as plugs 12A. As can further be seen in FIG. 1, the transition piece 19 of the flexible printed circuit board 10 bridges a spatial distance between the first circuit carrier 2 and the second circuit carrier 3. Furthermore, a temperature sensor 6 designed as an NTC element is arranged in the lower leg of the U-shaped flexible printed circuit board 10 and measures the temperature in the region of the four power semiconductor switches S1, S2, S3, S4. The corresponding sensor signals are transmitted via corresponding lines 11 to the second circuit carrier 3 for evaluation.

As can further be seen in FIGS. 2 and 3, the flexible printed circuit board 10 comprises a conductor structure 14 designed as a meandering structure 14A, which is arranged in a lower leg of the U-shaped flexible printed circuit board 10 in the exemplary embodiment shown. The meandering structure 14A in the exemplary embodiment shown is electrically insulated from the lines 11 and from the heat sink 16 by applied plastic films. Alternatively, the conductor structure 14 can be formed as a zig-zag structure or as a spiral structure or as a strip structure. Additionally, or alternatively, the at least one conductor structure 10 can be arranged in the upper leg of the U-shaped flexible printed circuit board 10 in the connecting leg of the U-shaped flexible printed circuit board 10. For example, in an alternative exemplary embodiment (not shown) of the power circuit assembly 1, an additional second conductor structure 10 can be arranged in the upper leg of the U-shaped flexible printed circuit board 10.

The flexible printed circuit board 2 comprises not only the meandering structure 14A of the at least one conductor structure but also several lines 11, which are used as signal lines for control and/or sensor signals or as supply lines. In the exemplary embodiment shown, the flexible printed circuit board 10 is designed in a single layer. In an alternative exemplary embodiment not shown, the flexible printed circuit board 10 is designed in multiple layers, wherein the at least one conductor structure 14 extends over several layers.

As can further be seen in FIG. 1, the flexible printed circuit board 10 comprises an outer, thermally conductive coating 15 at least in the region of the conductor structure 14. In the exemplary embodiment shown, the outer, thermally conductive coating 15 in the region of the conductor structure 14 is connected to a second metal layer 17A of the first circuit carrier 2 as a heat sink 16, said second metal layer being arranged on the ceramic layer 17B of the first circuit carrier 2 designed as an AMB substrate 2A. As a result, heat from resistor power losses of the conductor structure 14 designed as a meandering structure 14A is transferred via the second metal layer 17A, the ceramic layer 17B and the first metal layer 17C of the first circuit carrier 2 as a heat sink 16 via the solder layer 17D into the cooling device 18. Alternatively, the conductor structure 14 designed as a meandering structure 14A can be thermally connected directly to the cooling device 18 by soldering or gluing or sintering or via the outer, thermally conductive coating 15.

As can further be seen in FIG. 1, in the exemplary embodiment shown of the power circuit assembly 1, a voltage transformer 9, which converts a high voltage of the energy store 7 into a low voltage of less than 60 volts, is arranged on the second circuit carrier 3. In this case, a high-voltage connection HV of the voltage transformer 9 is connected to the energy store 7. A low-voltage connection NV of the voltage transformer is connected to a discharge switch 4 arranged on the second circuit carrier 2. The discharge switch 4 is designed as a semiconductor switch 4A, the control input of which can be actuated by an evaluation and control unit 5. In response to a corresponding actuation signal of the evaluation and control unit 5, the discharge switch 4 electrically connects the discharge resistor 13, which is designed as the conductor structure 14, to the energy store 7 for active discharging. This enables active discharging of the energy store 7, in particular during maintenance or in the case of crashes. As can further be seen in FIG. 1, the discharge switch 4 is arranged between the low-voltage output NV of the voltage transformer 9 and the at least one contacting region 12 of the flexible printed circuit board 10. In addition, a measuring resistor 8 is arranged between the discharge switch 4 and the at least one contacting region 12 of the flexible printed circuit board 10 and can be used to measure a current discharge current.

Embodiments of the power circuit assembly 1 according to the present invention are preferably used in an inverter for an AC electric machine, which inverter is looped in between a DC voltage supply and the AC machine.

The invention claimed is:

1. A power circuit assembly for a vehicle, comprising:
  a first circuit carrier on which at least two power semiconductor switches are arranged;
  at least one energy store configured to provide a high voltage and which can be discharged via at least one discharge resistor;
  a second circuit carrier on which at least two driver circuits are arranged, which are respectively assigned to one of the at least two power semiconductor switches; and
  a flexible printed circuit board which includes at least one line and electrically connects the first circuit carrier and the second circuit carrier to one another;
  wherein the at least one discharge resistor is configured as a conductor structure and is integrated into the flexible printed circuit board, wherein the flexible printed circuit board is thermally coupled to a heat sink in a region of the at least one conductor structure so that heat from resistor power losses of the at least one conductor structure is transferred directly to the heat sink.

2. The power circuit assembly according to claim 1, wherein the at least one conductor structure is configured as a meandering structure or as a zigzag structure or as a spiral structure or as a strip structure.

3. The power circuit assembly according to claim 1, wherein the flexible printed circuit board includes multiple layers, wherein the at least one conductor structure extends over several layers.

4. The power circuit assembly according to claim 1, wherein the flexible printed circuit board is connected to the heat sink at least in the region of the at least one conductor structure by soldering or by gluing or by sintering or via an outer thermally conductive coating of the flexible printed circuit board.

5. The power circuit assembly according to claim 1, wherein the first circuit carrier is configured as an AMB substrate or as a DBC substrate.

6. The power circuit assembly according to claim 5, wherein the first circuit carrier is thermally connected to a cooling device via a first metal layer.

7. The power circuit assembly according to claim 1, wherein the flexible printed circuit board is connected to the heat sink at least in the region of the at least one conductor structure via an outer thermally conductive coating, and wherein the outer thermally conductive coating of the flexible printed circuit board is connected to a second metal layer of the first circuit carrier as the heat sink.

8. The power circuit assembly according to claim 1, wherein the flexible printed circuit board is electrically connected to the second circuit carrier via a transition piece and at least one contacting region.

9. The power circuit assembly according to claim 1, wherein a discharge switch arranged on the second circuit carrier is configured to electrically connect the at least one discharge resistor to the at least one energy store for active discharging.

10. The power circuit assembly according to claim 1, wherein a voltage transformer, which converts a high voltage of the at least one energy store to a low voltage of less than 60 volts, is arranged on the second circuit carrier.

11. The power circuit assembly according to claim 10, wherein the flexible printed circuit board is electrically connected to the second circuit carrier via a transition piece and at least one contacting region, wherein a discharge switch arranged on the second circuit carrier is configured to electrically connect the at least one discharge resistor to the at least one energy store for active discharging, and wherein the discharge switch is arranged between a low-voltage output of the voltage transformer and the at least one contacting region of the flexible printed circuit board.

12. The power circuit assembly according to claim 11, wherein a measuring resistor is arranged between the discharge switch and the at least one contacting region of the flexible printed circuit board and can be used to measure a current discharge current.

13. An inverter for an AC electric machine, wherein the inverter is looped in between a DC voltage supply and the AC machine and comprises:

at least one power circuit assembly, including:
a first circuit carrier on which at least two power semiconductor switches are arranged,
at least one energy store configured to provide a high voltage and which can be discharged via at least one discharge resistor,
a second circuit carrier on which at least two driver circuits are arranged, which are respectively assigned to one of the at least two power semiconductor switches, and
a flexible printed circuit board which includes at least one line and electrically connects the first circuit carrier and the second circuit carrier to one another,
wherein the at least one discharge resistor is configured as a conductor structure and is integrated into the flexible printed circuit board, wherein the flexible printed circuit board is thermally coupled to a heat sink in a region of the at least one conductor structure so that heat from resistor power losses of the at least one conductor structure is transferred directly to the heat sink.

* * * * *